United States Patent [19]

Liau et al.

[11] Patent Number: 4,468,850
[45] Date of Patent: Sep. 4, 1984

[54] GAINASP/INP DOUBLE-HETEROSTRUCTURE LASERS

[75] Inventors: Zong-Long Liau, Arlington; James N. Walpole, Concord, both of Mass.

[73] Assignee: Massachusetts Institute of Technology, Cambridge, Mass.

[21] Appl. No.: 363,299

[22] Filed: Mar. 29, 1982

[51] Int. Cl.[3] .......................................... H01L 21/208
[52] U.S. Cl. .................................. 29/569 L; 29/576 E; 29/574; 29/580; 148/171; 148/174; 156/626; 156/649
[58] Field of Search .............. 29/569 LV, 576 E, 580, 29/574; 148/171, 175, 174; 372/45; 156/626, 649

[56] References Cited

U.S. PATENT DOCUMENTS

| | | | |
|---|---|---|---|
| 3,359,143 | 12/1967 | Heywang et al. | 148/174 |
| 3,716,405 | 2/1973 | Lim | 148/174 |
| 3,982,261 | 9/1976 | Antypas | 357/16 |
| 4,276,098 | 6/1981 | Nelson et al. | 29/569 L X |
| 4,287,485 | 9/1981 | Hsieh | 331/94.5 H |
| 4,354,898 | 10/1982 | Coldren et al. | 156/649 X |
| 4,372,791 | 2/1983 | Hsieh | 29/569 L X |

FOREIGN PATENT DOCUMENTS 45031  4/1981  Japan ................................ 156/626

OTHER PUBLICATIONS

"Heterostructure Injection Lasers" by Morton B. Panish, *Proceedings of the IEEE*, vol. 64, No. 10, Oct. 1976; pp. 1512-1540.
"Fabrication and Characterization of Narrow Stripe InGaAsP/InP Buried Heterostructure Lasers" by Hirao et al.; *J. Appl. Phys.* 51 (8), Aug., 1980, pp. 4539 and 4540.
"InGaAsP Planar Buried Heterostructure Laser Diode (PBH-LD) with Very Low Threshold Current" by Mito et al., *Electronic Letters*, vol. 18, No. 1, Jan. 7th, 1982.
"Groove GaInAsP Laser on Semi-Insulating InP" by Yu et al., *Electronics Letters*, vol. 17, No. 21, Oct. 15th, 1981, pp. 790-792.
"InGaAsP/InP Buried Crescent Laser Emitting at 1.3 μm with Very Low Threshold Current by Murotani et al., *Electronics Letters*, vol. 16, No. 14, Jul. 3rd, 1980, pp. 566-568.
"Mesa-Substrate Buried-Heterostructure AgInAsP-/InP Injection Lasers" by Kishino et al., *Electronics Letters*, vol. 15, No. 4, 2/15/79, pp. 134-136.
"Embedded Epitaxial Growth of Low-Threshold GaInAsP/InP Injection Lasers" By Chen et al., *Appl. Phys. Lett.*, 38 (5), Mar. 1, 1981, pp. 301-303.
"Monolithic Integration of InGaAsP Heterostructure Lasers and Electrooptical Devices" By Wright et al., *IEEE Journal of Quantum Electronics*, vol. QE-18, No. 2, Feb. 1982, pp. 249-258.

*Primary Examiner*—G. Ozaki
*Attorney, Agent, or Firm*—Arthur A. Smith, Jr.; Leo Reynolds

[57] ABSTRACT

A method and apparatus is described wherein a buried double heterostructure laser device is formed utilizing epitaxial layers of quaternary III-V alloys of gallium indium arsenide phosphide and wherein the buried layer is formed by first etching the p-type top layer of the structure down to the quaternary active layer forming a mesa. A second etchant is then provided which preferentially etches the active layer. This etchant is used to undercut the top layer by removing the active layer on both sides of the top mesa surface providing a narrow strip of active layer underneath the undercut mesa. The undercut is then filled in by a heat treatment process which results in migration or transport of the binary top layer and binary bottom layer to fill in the undercut, leaving the active layer buried in the binary material. In an alternate embodiment of the invention, the two-step etching process plus the transport phenomena is utilized to form the mirror surface of a laser device. The device may include a support mesa and control mesa structure and may also be used to fabricate optical waveguide structures.

36 Claims, 18 Drawing Figures

STEP 1 - FORMING
GaInAsP/InP DH WAFER

STEP 2 -
HCl ETCHING

STEP 3 -
GaInAsP ACTIVE LAYER ETCHING WITH
UNDERCUTTING

STEP 4 -
TRANSPORT OF InP

STEP 5 -
HCl ETCHING TO FORM THE LASER MIRROR

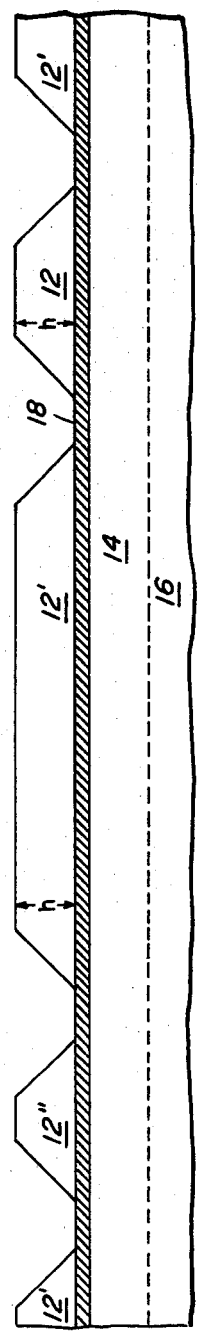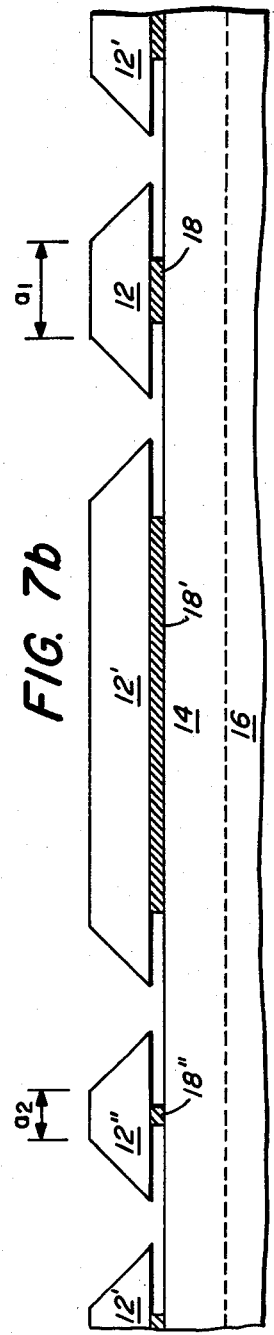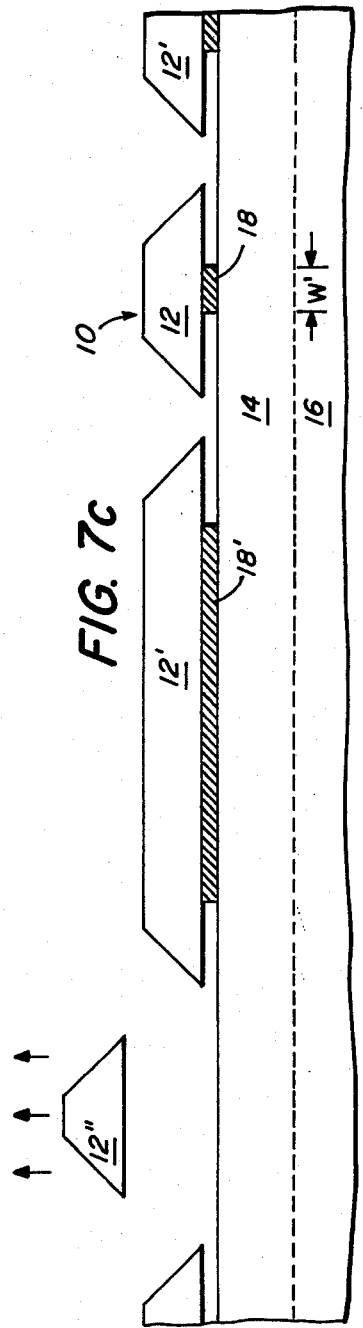

4,468,850

GAINASP/INP DOUBLE-HETEROSTRUCTURE LASERS

GOVERNMENT SUPPORT

The Government has rights in this invention pursuant to Contract No. AF19(628)-80C-0002 awarded by the Department of the Air Force.

TECHNICAL FIELD

This invention is in the field of semiconductor lasers and more particularly relates to GaInAsP/InP double-heterostructure (DH) lasers capable of pulsed and cw operation at room temperature.

BACKGROUND ART

Semiconductor lasers capable of producing continuous stimulated radiation at wavelengths in the vicinity of 1.1–1.7 $\mu$m at room temperature are of interest for communications systems using fiber optics, since it is in this wavelength range that both the transmission losses and the dispersion in high-quality glass fibers are low.

Semiconductor lasers of quaternary III-V alloys of GaInAsP grown on a binary compound of InP (double heterostructures or DH) have proven practical for operation at this frequency range. Furthermore, a particular type of laser construction, i.e., the buried layer type or BH laser for "buried heterostructure" laser; wherein the active layer (GaInAsP) is both vertically and laterally confined (*Proceedings of the IEEE*, Vol. 64, No. 10, Oct. 76, pp 1528–1529), has been of particular importance for reducing threshold current, $I_{th}$, in semiconductor lasers.

As a result of this interest, various techniques for fabricating BH laser diodes have evolved. The most commonly used technique is represented by Hirao et al., "Fabrication and Characterization of Narrow Stripe InGaAsP/InP Buried Heterostructure Lasers", *J. Appl. Phys.* 51(8) August 1980. In the Hirao et al. technique, a mesa structure is formed by chemical etching such that the active layer is located just above the neck of the mesa. Then, p- and n-type epitaxial InP "burying" layers are regrown on the exposed surfaces of the crystal. This method suffers from the difficulties attendant with epitaxial regrowth, especially over non-planar surfaces. In addition, it is difficult to obtain uniformly etched mesas and the thicknesses of the regrown layers are critical.

I. Mito et al. in "InGaAsP Planar Buried Heterostructure Laser Diode (PBH-LD) with Very Low Threshold Current", *Electronics Letters*, Vol. 18, No. 1, Jan. 7, 1982, have devised an improved planar BH laser diode structure in which the initial "burying" layers are formed on both sides of the mesa, but not on the mesa top which at this point comprises the active layer. Next, p-InP embedding and n-InP cap layers are grown by the liquid phase epitaxial (LPE) process over this "planar" surface. This technique suffers from the problems of LPE regrowth, especially on the narrow width active layer mesa top; which tends to inhibit proper nucleation for epitaxial growth.

K. L. Yu, et al., in "Groove GaInAsP Laser on SemiInsulating InP", *Electronics Letters*, Vol. 17, No. 21, Oct. 15, 1981, provides yet another solution to this vexing problem in which a single LPE growth is made on a grooved substrate. While this solution eliminates the need for two LPE growth steps, it requires etching of dovetail shaped grooves and subsequent LPE growth over such non-planar surfaces.

Murotani et al. in "InGaAsP/InP Buried Crescent Laser Emitting at 1.3 um with Very Low Threshold Current", *Electronics Letters*, Vol. 16, No. 14, July 3, 1980, have devised a structure similar to Yu et al. above, in that LPE is required over etched grooves in order to achieve a BH laser diode. Also, Kishino et al. "Mesa-Substrate Buried-Heterostructure GaInAsP/InP Injection Lasers", *Electronics Letters*, Vol. 15, No. 4, Feb. 15, 1979, have fabricated GaInAsP/InP DH lasers of the BH type utilizing a single-step epitaxial growth which they call the mesa-substrate buried-heterostructure (m.s.b.) laser. In the m.s.b. structure, the active region is formed by LPE growth over a non-planar mesa substrate.

Lastly, Chen et al., in "Embedded Epitaxial Growth of Low-Threshold GaInAsP/InP Injection Lasers", *Appl. Phys. Lett.* 38(5), Mar. 1, 1981, discloses a GaInAsP/InP laser device structure formed by single embedded LPE growth through oxide openings in a mask. Again, this technique suffers from the dual problem of (a) the difficulty of inducing proper nucleation on narrow strips of exposed substrate and (b) the resultant non-planar structure produced (as shown in FIG. 2 of Chen et al.).

In addition to the above described fabrication problems, high yield and low threshold current, $I_{th}$, have been the goals of those skilled in the art. $I_{th}$ is related to the width of the active region. The narrower the better. Mito et al., above referenced, reports the lowest CW threshold current, $I_{th}$, attained with their structure was 8.5 mA at room temperature and the best laser devices of Murotani et al. (above referenced) operated at "the very low" threshold current of 28 mA CW at room temperature.

Accordingly, it would be highly desirable to obtain a double heterostructure laser diode of the BH type wherein the active layer is uniformly and narrowly defined, conventional epitaxial regrowth on a non-planar surface is eliminated, the yield is high and the $I_{th}$ is below 10 mA CW at room temperature.

SUMMARY OF THE INVENTION

The present invention relates to a novel process and apparatus for the fabrication of buried heterostructure (BH) lasers and more particularly, GaInAsP/InP BH lasers. In accordance with the invention, an active layer of quaternary III-V alloy is grown on a binary III-V compound substrate using conventional liquid phase epitaxial (LPE) techniques. A top layer of a binary III-V compound is similarly epitaxially grown on the active layer.

Next, an oxide stripe mask is formed by conventional photolithography techniques on the top layer and a region of oxide coating is formed over the active layer. It should be noted that no further conventional epitaxial growth is required to fabricate the device of the invention.

Next, an undercut mesa structure is formed by a twostep selective chemical etch. A first etchant is used to remove the top layer where it is not protected by the oxide coating. This top layer is removed down to the active quaternary layer at which point the first etchant step is immediately terminated and a new etchant is used to remove the active layer underneath the remaining top layer, except for a thin volume of active material underlying the remaining top mesa structure.

Next, the structure formed as above, is subjected to a controlled temperature cycle which produces a transport of material so as to fill in the void left at the undercut region and thereby enclose the sides of the remaining volume of the active material.

Lastly, ohmic contacts are provided across the device to enable current to be passed through the structure to produce lasing.

The process and apparatus thus described has resulted in laser devices with threshold current as low as 6.4 mA (the lowest reported threshold current in the literature to date). While the device will be described in connection with quaternary and binary III-V materials, a similar process may be applied to other semiconductor materials operating in other spectral regions, such as the lead-tin chalcogenides (IV-VI materials) in the 4–30 $\mu$m wavelength region.

Furthermore, as will be described in detail, the process of migration of semiconductor material at elevated temperature, hereinafter sometimes referred to as "mass transport phenomenon", may also be used to improve the fabrication of etched mirror surfaces of laser diode devices. In the past, attempts to provide etched mirror surfaces in heterostructures have proven difficult owing to the differences in etch rate which occur when etching dissimilar materials. As will be described in the present invention, "the mass transport phenomenon" is used to bury one of the dissimilar materials, i.e., the active layer, to totally eliminate the problems caused by different etch rates. Thus, the finished mirror surface should be nearly equal to the quality of cleaved mirror surfaces, enabling the complete laser diode device to be fabricated by an etching process without the necessity for a separate cleaving operation, as is presently required in order to fabricate high quality mirror surfaces of laser structures (See, for example, U.S. Pat. No. 3,982,261).

BRIEF DESCRIPTION OF THE DRAWINGS

FIG. 2a shows the structure prior to etching.

FIG. 2b shows the structure after the first etching process has occurred.

FIG. 2c shows the structure after the second etching process has occurred.

FIG. 2d shows the structure after heat treatment and resultant migration.

FIG. 7 shows a cross-sectional view of a wafer in which portions of the wafer adjacent the laser diode device 10 of the previous figures are depicted.

DESCRIPTION OF PREFERRED EMBODIMENT

Figure 1:
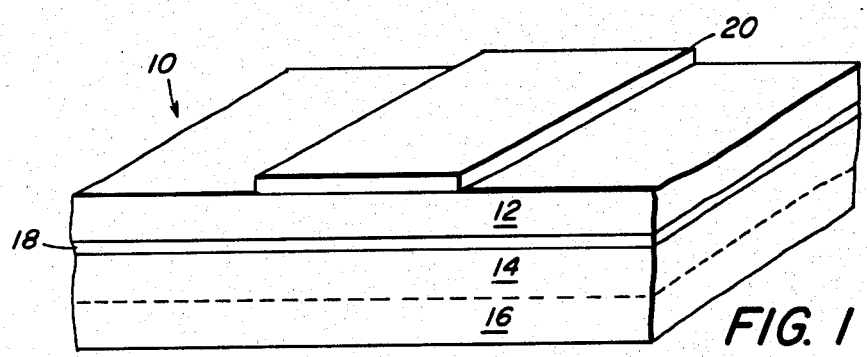
FIG. 1 is a perspective view of a portion of the starting structure for the process and apparatus of the invention.

Referring now to FIG. 1, the starting wafer or sample for the double heterostructure laser semiconductor in accordance with the invention, is prepared by conventional liquid phase epitaxial (LPE) techniques. First, an indium phosphide (InP) substrate 16 is provided. The substrate 16 is doped with a concentration of $1 \times 10^{18}$cm$^{-3}$ n-dopant such as tin, Sn. Next, a layer 14 of indium phosphide is provided by LPE over the substrate 16. This layer serves as a buffer layer and is preferably n-doped with tin to a concentration of about $2 \times 10^{18}$cm$^{-3}$. The thickness of layer 14 is about 4 microns. The buffer layer 14 of indium phosphide is formed on the substrate 16 prior to LPE growth of active layer 18 to eliminate surface defects in the substrate surface of the type caused by thermal etching, etc.

An active layer 18 of GaInAsP is then formed over the buffer layer 14, again by conventional LPE techniques. The active layer is a very thin film of about 0.2 $\mu$m and is n-doped to a concentration of about $1 \times 10^{17}$cm$^{-3}$.

Next, a top layer 12 of indium phosphide is provided over layer 18 with a p-type dopant to a concentration of about $5 \times 10^{17}$cm$^{-3}$. Top layer is about 3 $\mu$m thick. Using photolithographic techniques, an oxide stripe 20 is provided over the top layer 12 of device 10. The stripes of oxide 20 are 5–6 $\mu$m wide on 250 $\mu$m centers with the stripes parallel to either the <011> or <01$\bar{1}$> crystallographic directions, preferably the substrate 16 is oriented in the <100> crystallographic plane.

Figure 2A:
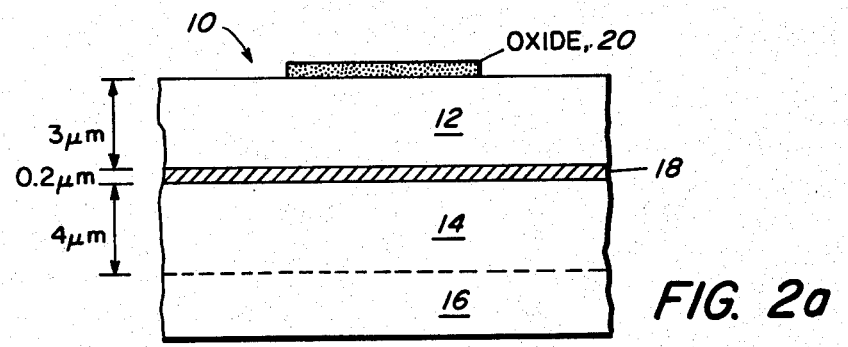
FIGS. 2a–2d are cross-sectional views of the structure of FIG. 1 during various stages of the process.
Figures 2B, 2C:
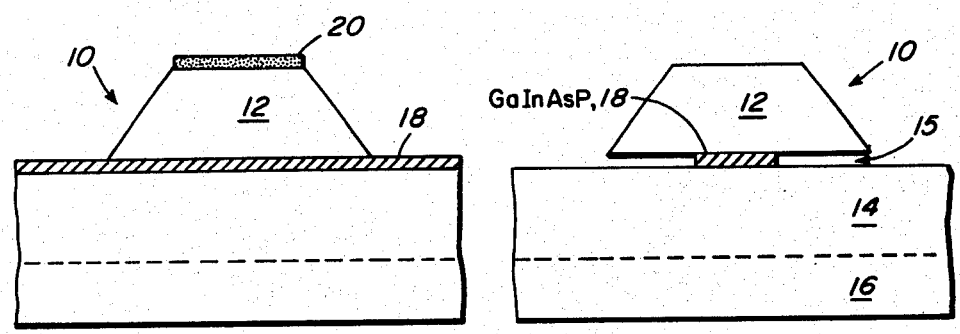
Figure 4A:
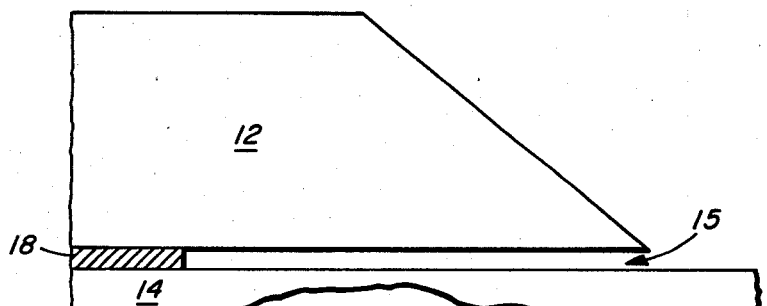
FIG. 4a–4c show an enlarged sectional view of the various stages of the mass transport phenomenon resulting in the buried heterostructure.

Next, two steps of selective chemical etching occur in order to produce the mesa structure shown in FIG. 2c and in enlarged view in FIG. 4a. First, as shown in FIG. 2b, concentrated HCL etchant is used to remove the InP top layer 12 not underlying the oxide 20. While being etched, the sample 10 is well agitated and closely monitored visually for the slight color difference produced when the HCL exposes the quaternary active layer 18 versus the color of the InP layer 12. When this color change occurs, the HCL etching step is immediately terminated and the InP top layer is completely etched through, as shown in FIG. 2b.

The oxide 20 is removed by conventional techniques. Next, both sides of the quaternary Ga$_{0.27}$In$_{0.73}$As$_{0.63}$P$_{0.37}$ active layer 18 thus exposed are then removed with a 50-ml aqueous solution of 10-g KOH and 0.2-g K$_3$Fe(CN)$_6$. Depending on the duration of etching time, any desired amount of undercutting 15 of the active quaternary layer 18 may be achieved [See FIG. 2(c)].

After completion of the above two etching steps, the sample 10 is heat treated in the following manner to cause migration of the InP material in layers 12 and 14 so as to result in the buried heterostructure shown in FIG. 2(d). First, the sample 10 is dipped in buffered HF for about one minute and loaded into an LPE system with a freshly baked graphite slider, but without any growth solution. The sample 10 is placed in a shallow slot on the graphite slider and covered by a graphite plate. The LPE system is purged with H$_2$ and PH$_3$ while being heated to about 670° C. The H$_2$— and PH$_3$— flow rates are preferably selected so that almost no surface changes are observed on planar InP substrates (except for regions near the edges) under the heating cycle used. The sample is heated to a temperature of about 670° C. in approximately 30 minutes and maintained at that temperature for another 30 minutes before being rapidly cooled down. The temperature should be less than the melting point of InP and should not be of sufficient duration or level as to cause diffusion of the layer materials. While a temperature of 670° C. was used in fabricating samples, a range of about 650° C. to 700° C. is believed to be suitable for causing migration of the InP material.

Figure 4B:
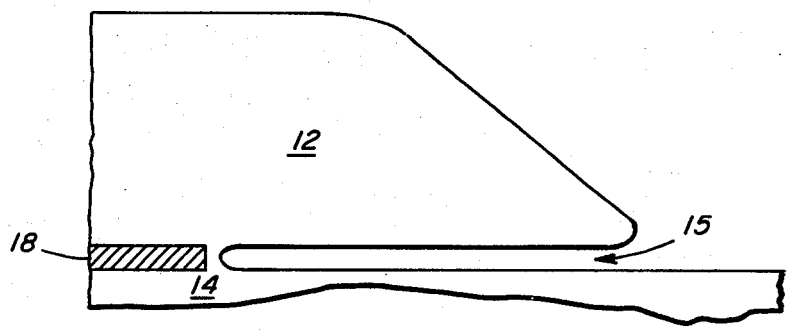
Figure 4C:
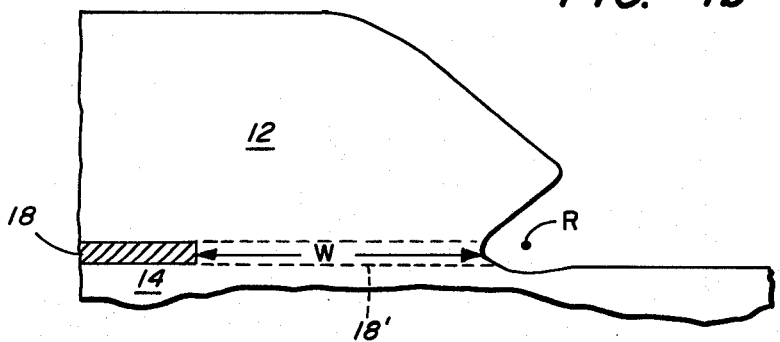

FIGS. 4(a)-(c) show an enlarged portion of a cross section of the sample before [FIG. 4(a)], during [FIG. 4(b)], and after [FIG. 4(c)] being heat treated in the LPE system. As may be seen by comparing FIGS. 4(a), 4(b), and 4(c), the heat treatment results in a marked change in the shape of the mesa 12. In FIG. 4(a), the undercut in the InP top layer 12 is about 2 to 4 $\mu$m from each side leaving a neck-shaped active quaternary region 18 typically 1.0 $\mu$m in width, but adjustable to as narrow as 0.3 $\mu$m in width. During the course of the heat treatment, as may be seen in FIG. 4(b), the transport phenomenon results in a migration of the indium phosphide which is first noticeable by a rounding of the corners, as may be seen in FIG. 4(b), and gradually the narrow undercut channel 15 is filled in with indium phosphide. This phenomenon has been reproducibly observed in 38 experiments with the noticeable exception of one in which the PH$_3$ (phosphine gas) was not used.

The width W of the material adjacent to the active layer 18 varies between 0.5 $\mu$m and 2 $\mu$m depending mainly on the amount of the undercut. The recess R at the base of the final mesa, which is evident in FIG. 4(c), may be reduced or totally eliminated with a smaller initial undercut 15. Mesa tops which are initially narrower than about 2 $\mu$m are completely rounded after the heat treatment, whereas those which are wider retained a flat top, as in FIG. 4(c).

The phosphine gas present during the heat treatment tends to stabilize the material. Otherwise, the exposed indium phosphide would decompose, given the temperature (about 670° C.) required in order to obtain a transport of material. Use of the phosphine in the system results in a smooth finish surface all over the sample. In addition, the resulting high phosphorus pressure may also assist the transport process.

As stated earlier, the exact nature of the transport phenomenon is not apparent at this time, however, it seems to be related to the fact that just as nature abhors a vacuum, nature does not like the sharp discontinuities present in the structure of FIG. 4(a) and prefers to reach a structure of minimum energy, such as FIG. 4(c). There appears to be a substantial amount of surface energy associated with sharp corners, thus if the temperature is raised enough, such that the atoms of the material become more mobile on the surface, they will tend to redistribute themselves in a configuration that achieves a lower surface energy, such as that of FIG. 4(c).

The material provided by the transport phenomenon in the transport region 18' of the structure, serves several purposes. First, it passivates the interface between the active layer 18 and the surrounding outside air. Secondly, it serves as a cladding material for the optical waveguide surrounding the active layer 18. And, thirdly, the material serves to confine the electrical carriers.

To complete the processing, the sample [as shown in FIG. (3)] is coated with an oxide 32 by conventional techniques and an opening through the oxide layer is provided by photolithography techniques on the mesa top. Next, a shallow zinc diffusion is made through the openings in the oxide, as shown at 30 in FIG. 3. After the zinc diffusion, Au-Zn alloy contacts are made to the p+ indium phosphide zinc diffused layer 30 on the indium phosphide mesa top 12. The sample is then lapped from the substrate side to a thickness of 100 $\mu$m and a Au-Sn alloy contact 28 applied to the bottom surface of the structure 16.

Next, titanium (200 Å) and gold (500 Å) layers (not shown) are sputter deposited over the entire sample on the mesa side to facilitate contacting. Individual buried heterostructure lasers are then obtained by cleaving and sawcutting. The cleaving provides a mirror surface 34 on either end of the structure and upon the introduction of current, as shown by the arrow in FIG. 3, a light output 36 is emitted from the active region 18 on either end of the structure. Note that the transported indium phosphide region adjacent the active region is shown in dotted lined at 18'.

Table 1 below indicates some of the properties of the quaternary BH lasers fabricated from seven wafers by the transport of indium phosphide in accordance with the invention.

TABLE 1

| Wafer | Active Region Widths ($\mu$m) | Lowest Threshold Current (mA) | Device Length ($\mu$m) |
| --- | --- | --- | --- |
| 1 | 3.9–4.5 | 33.0 | 406 |
| 2 | 1.8–2.5 | 20.0 | 254 |
| 3 | 0.7–1.4 | 13.8 | 305 |
| 4 | 0.7–1.5 | 9.0 | 279 |
| 5 | 1.0–2.2 | 58.0 | 254 |
| 6 | 3.0–3.6 | 16.0 | 254 |
| 7 | 1.0–2.0 | 6.4 | 254 |

Figure 3:
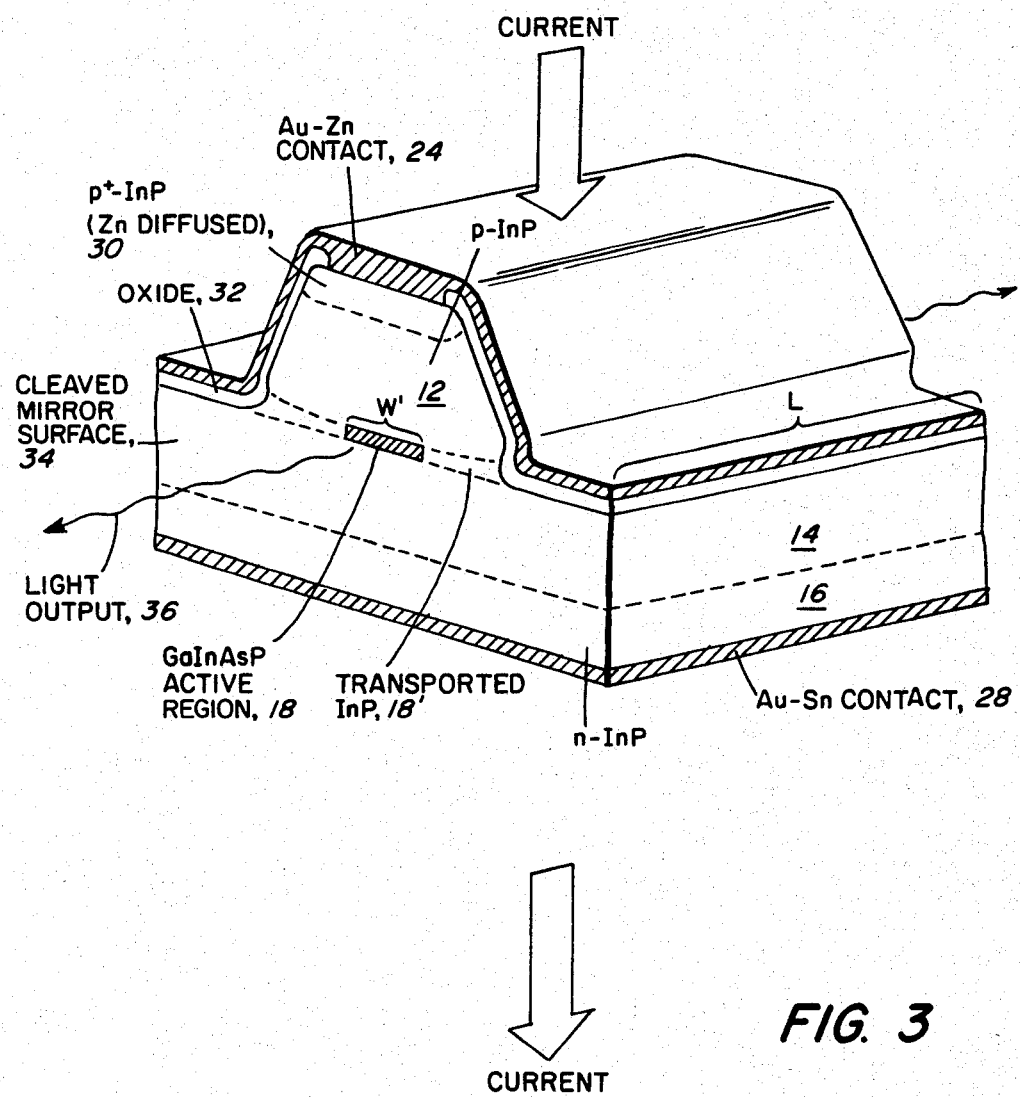
FIG. 3 shows a finished laser diode in accordance with the invention.

For wafer No. 1, the width W' of the active region shown in FIG. 3 is between 3.9-4.5 $\mu$m. The lowest threshold current in mA for any of the laser diodes on wafer No. 1 was 33 mA and the length L, shown in FIG. 3, for the individual laser diodes was 406 $\mu$m.

In wafer 7, the lowest threshold current was 6.4 mA which is lower than the lowest reported value of 8.5 mA. In addition to the low threshold current provided by the process of the invention, there are other advantages which should be noted. The fabrication process is extremely simple, both <011> and <01$\bar{1}$> crystallographic orientation can be used for the stripes whereas in some processes, because of the required etching path, only one orientation is available for use. The process provides smooth striped edges, a very narrow active region, and precise control over the active region width W'.

The resultant structure is nearly planar and a heat sink can be readily attached to it if (as will be described in connection with FIGS. 7a-7c), the adjacent mesa sides are utilized to support an active device in between. The process appears to be capable of producing high yield. Furthermore, there is no melt-back problem in LPE regrowth, such as occurs in the prior art structures.

Figure 2D:
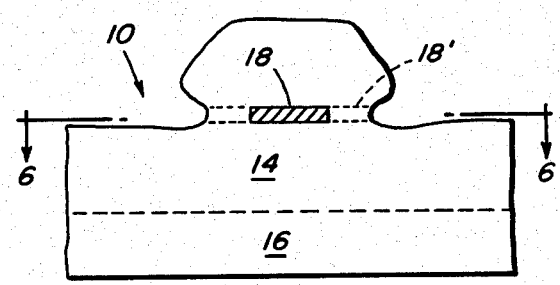
Figure 6:
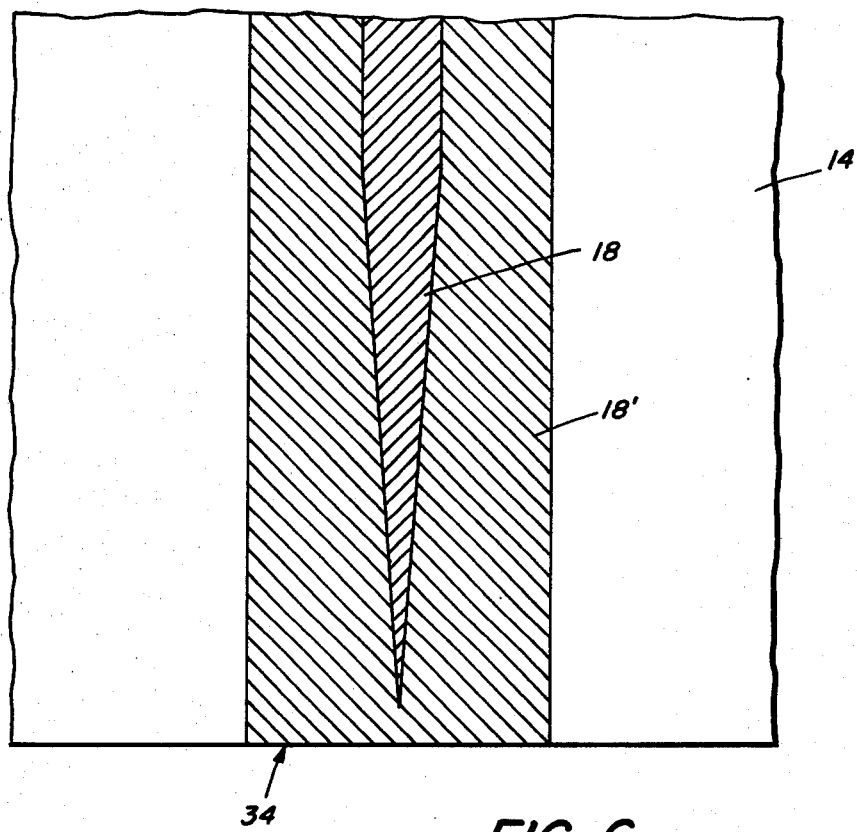
FIG. 6 shows a cross-sectional view taken along lines 6—6 of FIG. 2d showing the tapered buried layer structure.

FIG. 6 is an enlarged cross sectional view taken along lines 6—6 of FIG. 2d or FIG. 4c showing the tapered buried layer structure of the active region 18 surrounded by the transported material in the transport region 18'. As may be seen in FIG. 6, in regions near the laser mirror surface 34, the etching process can result in a laterally tapered waveguide structure for the active region 18 which in turn produces very narrow beam divergence. This tapered waveguide results in regions where the oxide layer 20 terminates. Apparently, in this region, the second etchant (the potassium ferricyanide etchant used to dissolve the active layer) can attack the active layer from three directions producing the tapered structure shown in FIG. 6.

While the heretofore described embodiment has been explained in connection with the use of a wet chemical etching process, it is contemplated that other means of producing the undercut 15 may be realized by those skilled in the art, such as plasma etching. Furthermore, while the layers have been described as being deposited by liquid phase epitaxy, other well-known means of depositing layers, such as chemical vapor deposition, may be utilized.

This completes the description of a first preferred embodiment of the invention. FIGS. 5(a)-5(e) describe yet another emobdiment of the invention wherein the transport phenomenon is utilized to provide the mirror surfaces for the buried heterostructure laser diode. It should be noted that like items bear like numbers in the apparatus of FIGS. 5(a)-(e) and are numbered corresponding to the similar items in previously described FIGS. 1-4.

In the embodiment of FIG. 5, there is shown a sectional side view of a buried heterostructure laser diode formed in accordance with the teachings of the present invention, or alternatively, it may be formed in accordance with any of the prior art devices. The objective in this embodiment is to form the mirror surface required for proper operation of the laser diode on the surface shown by the arrow M in FIG. 5a. In the past, such mirror surfaces have been fabricated by cleaving and by etching. The cleaving process suffers from the difficulty attendant with attempting to cleave surfaces of such small size when dozens or hundreds of such devices are fabricated on a single wafer. Furthermore, it would be desirable to utilize the same process of photolithographic technology and etching to separate and form mirror surfaces after the photolithographic etching process has been used successfully to fabricate the individual buried heterostructures in the first instance. However, the conventional techniques for etched mirrors suffer from differential etching, since the active layer and the top and buffer layers are of different materials. In the present technique, the mirror regions to be etched are comprised of a single material, which totally eliminates the difficulties associated with differential etching.

The starting structure consists of a n-doped indium phosphide buffer layer 14 formed over a n-doped indium phosphide substrate 16. Next, a gallium indium arsenide phosphide p-doped very thin active layer 18 is formed over layer 14 and a p-doped indium phosphide top layer 12 is formed over the active layer 18. All of these layers are formed by conventional epitaxial growth techniques, such as LPE.

Figure 5A:
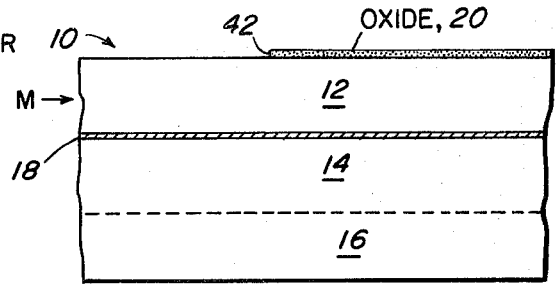
FIGS. 5a–5e show cross-sectional views of the use of the double etched mass transport phenomenon technique to fabricate laser diode mirror surfaces in accordance with the invention.

Next, an oxide mask is applied to the top layer 12 and an oxide coating which ends at surface 42, 20 is formed by conventional photolithography techniques. After the active region 18 has been buried, in accordance with the previously described techniques or other, more conventional, techniques, it is now desired to separate the individual laser diodes at each end, one end of which is shown in FIG. 5(a). Not only is it desired to separate the individual elements, but it is also desired to form a mirror surface on these long ends.

Figure 5B:
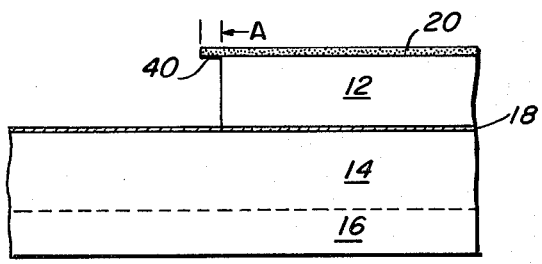

Thus, after the sample is fabricated, as shown in FIG. 5a, as described above, it is placed in an etchant bath of HCL for a sufficient length of time, such that the indium phosphide material 12, that is not under the oxide 20, is etched away and the etchant process is continued for a little while longer until the indium phosphide is etched a small distance (A), providing an overhang 40 underneath the oxide 20 (See FIG. 5b).

Figure 5C:
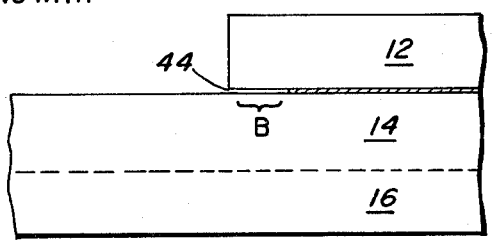

In the next step of the process, (step 3 shown on FIG. 5(c)), the oxide 20 is removed by conventional techniques and the gallium indium arsenide phosphide quaternary active layer is etched away using a different etchant than the HCL etchant. The etchant required for this step is the same as that previously utilized in connection with the embodiment of FIG. 2; that is a 50 ml aqueous solution of 10 g KOH and 0.2 g $K_3Fe(CN)_6$ (potassium ferricyanide) is utilized. This etching process is allowed to continue until the undercut 44 region is produced for a distance (B), as shown in FIG. 5(c). Next, the sample is subjected to a heat treatment, in which it is heated to a temperature of about 670° C. in a LPE chamber with flowing phosphine gas, as previously described in connection with FIG. 2(c).

Figure 5D:
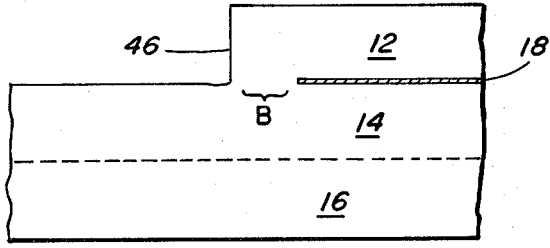

This temperature treatment results in transport of the indium phosphide in layers 12 and 14 to fill in the undercut 44 of FIG. 5(c), resulting in the structure shown in FIG. 5(d).

Figure 5E:
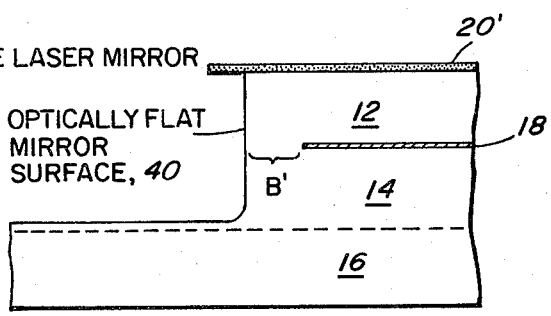

Next, as shown in FIG. 5(e), an oxide 20' is formed on the top layer 12 and surface 46 is etched in a solution of HCL for a sufficient time to produce an optically flat mirror surface 46, as shown in FIG. 5(e). The net result is an optically flat mirror surface at 46, with a small separation between the end of the laser active region 18 and the mirror surface, B'.

The fact that the active region of the laser does not reach the mirror surface, which it does in almost any other kind of buried layer heterostructure device, minimizes damage to the mirror surface when laser emission occurs. In prior art devices in which the active layer extends to the mirror surface, surface states form which cause local heating by absorption of light at the mirror surface and resultant damage to the mirror. It therefore limits the amount of power that can be put through the mirror before it is damaged. In other words, the mirror surface would act as an absorber of light in such prior art devices. All of these damaging effects are alleviated by providing a gap between the mirror surface and the active layer 18, as shown in FIG. 5(e)

Referring now to FIGS. 7(a)-7(c), the regions adjacent the laser diode structure 10 on a wafer fabricated in accordance with the invention, will be described. FIG. 7(a) shows a sectional view of a wafer after the HCL etching step, previously described in connection with FIGS. 2(a) and 2(b) has been accomplished. As may be seen in FIG. 7(a), support mesas 12' are located on each side of the previously described laser mesa 12. Also, a control mesa 12" is provided between supporting mesas 12' [as shown in FIG. 7(a)]. Each mesa 12, 12' and 12" is formed on active layer 18 which in turn is formed on layers 14 and 16, all as previously described.

The purpose of the support mesa 12' is to provide a broad planar support structure. The support mesa 12' is fabricated by the same process and at the same time as the laser mesa 12. Hence, each mesa is substantially the same height, h, as any other mesa and forms a substantially planar structure, except for the etched out intermediate portions between mesas.

The control mesa 12″ is provided as a control for establishing the final width $W^1$ of the buried layer 18. This is accomplished, as shown in FIGS. 7(b) and 7(c), by making the width of the oxide coatings used to define the top width $a_1$ and $a_2$ of mesas 12 and 12″ respectively, such that $W^1 = a_1 - a_2$.

If $W^1 = a_1 - a_2$ (and assuming the undercut etching rate is approximately the same), in principle, when the control mesa 12″ is completely separated by etching of 18″, the active layer strip 18 remaining under the laser mesa 12, should be equal to the width $W^1$, as shown in FIG. 7(c). Thus, by observing when the control mesa 12″ has lifted off layer 14 and stopping the etching process at this point, good control of $W^1$ may be obtained.

This completes the description of the preferred embodiments of the invention, however, it is to be understood that while lasers using a heterojunction of the quaternary III-V alloys of indium gallium arsenide phosphide have been chosen to illustrate the invention; other alloys may be utilized equally as well. As an example, alloys of the IV-VI semiconductors, such as germanium IV and selenium VI and lead and tellurium may be utilized. Similarly, instead of indium phosphide, other III-V alloys could be considered, such as gallium antimonide.

The term quaternary III-V alloy of InGaAsP means that the elements are proportioned according to the formula, $In_xGa_{1-x}As_yP_{1-y}$ or the equivalent mole fraction formula $In_{0.5x}Ga_{0.5-0.5x}As_{0.5y}P_{0.5-0.5y}$. Also, as stated earlier, the invention is not to be limited to any particular etchant, merely that the second etchant has to be capable of etching the active layer with negligible etching of the buffer layer or the top layer.

In the mirror embodiment, it is understood that the process therein described, could be used for fashioning any type of mirror surface, not merely mirror surfaces for the type of laser diode BH structure shown herein.

While the particular embodiments of the invention disclosed herein have been fabricated utilizing LPE techniques, it should be emphasized that suitable layers could be formed using other deposition techniques, such as vapor phase epitaxy or molecular beam epitaxy. Additionally, whereas the substrates enumerated herein have been n-type indium phosphide, it is clear that the substrates could be p-type, in which case the top layer would be of opposite type conductivity. Also, additional quaternary or other layers may be present in addition to those layers above enumerated.

Lastly, the process may be used to fabricate passive optical waveguides. In such a device, current would not be caused to flow through the active region 18 as in FIG. 3. Instead, the active region 18 would form a passive guiding region or waveguide for transmission of light. Such a waveguide has the advantage that it can be bent without suffering large optical losses.

Hence, the invention is not to be construed as limited to the particular embodiment shown and described herein. There are many equivalents to these specific embodiments and such equivalents are intended to be covered by the following claims:

1. The method of forming a semiconductor device comprising the steps of:
   (a) making a structure by:
      (i) forming a substrate;
      (ii) forming a first layer of semiconductor material over said substrate;
      (iii) forming a second layer of semiconductor material on the first layer;
      (iv) forming a coating over a portion of said second layer;
   (b) removing a portion of said second layer on two adjacent sides of said protective coating down to the top surface of said first layer;
   (c) removing a portion of said first layer underlying adjacent sides of said second layer so as to produce undercut areas beneath the remaining second layer with a volume of first layer therebetween, said volume of first layer having top, bottom and side walls, with two adjacent side walls thereby being exposed to the atmosphere; and
   (d) heating the structure in a controlled environment to a temperature which causes the material in the regions of the undercut areas to travel into the undercut area and enclose the exposed side walls.

2. The method of claim 1 wherein steps (b) and (c) are performed by different etchants; the etchant in step (c) being primarily effective in dissolving the first layer but not the second layer.

3. The method of claim 1 wherein the substrate and second layer is InP and the first layer is GaInAsP.

4. The method of claim 1 wherein the protective coating is an oxide layer formed by photolithography.

5. The method of claim 1 wherein the heating temperature in step (d) is less than the melting point of the materials used in the layers and the duration of heating and temperature is short enough and low enough to avoid substantial diffusion of materials.

6. The method of claim 3 wherein $PH_3$ gas is introduced during step (d) to minimize decompostion of InP.

7. The method of forming a semiconductor device comprising the steps of:
   (a) making a body by:
      (i) forming a substrate;
      (ii) forming a first layer of semiconductor material on the substrate;
      (iii) forming a second layer of semiconductor material on the first layer; and
      (iv) selectively forming coatings over portions of the second layer;
   (b) selectively removing portions of said second layer down to the top surface of the first layer forming at least a first mesa, and a control mesa on said first layer;
   (c) etching said first layer underlying the mesas to produce an undercut area beneath the mesas until the first layer material underlying the control mesa is removed; and
   (d) heating the body to cause the remaining material in the region of the undercut area to migrate into the undercut area adjacent the first mesa.

8. The method of claim 7 wherein the width of the coatings on the second layer for the first mesa and control mesa are respectively $a_1$ and $a_2$ and the desired width $W^1$ of the first layer material remaining under the first mesa in step (c) is equal to $a_1 - a_2$.

9. The method of claim 8 wherein step (b) and (c) are performed by different etchants; the etchant in step (c) being primarily effective in dissolving the first layer but not the second layer.

10. The method of claim 7 in which support mesas are formed adjacent the first mesa.

11. The method of forming a semiconductor laser comprising the steps of:
   (a) making a unitary structure by:

(i) forming a substrate of material doped to a predetermined level of conductivity;
(ii) forming an active layer of semiconductor material over said substrate;
(iii) forming a top layer of semiconductor material doped to a predetermined second level of conductivity;
(iv) forming a protective coating over a portion of said top layer;
(b) removing a portion of said top layer on two adjacent sides of said protective coating down to the top surface of said active layer;
(c) removing a portion of said active layer underlying adjacent sides of said top layer so as to produce undercut areas beneath the remaining top layer with a volume of active layer therebetween; the sides of said volume being exposed at the undercut areas and
(d) heating the unitary structure in a controlled environment to a temperature which causes the material in the regions of the undercut areas to migrate into the undercut area.

12. The method of claims 1, 7 or 11 in which the heating temperature is below the melting temperature of the second layer.

13. The method of claim 11 wherein step (b) and (c) are performed by different etchants; the etchant in step (c) being primarily effective in dissolving the active layer but not the top layer.

14. The method of claim 11 wherein the layers are epitaxially grown.

15. The method of claim 14 wherein the top layer and substrate are binary compounds and the active layer is a quaternary alloy.

16. The method of claim 15 wherein the top layer is doped with a p-type dopant and the active layer and substrate are doped with n-type material.

17. The method of claim 11 wherein a buffer layer is formed on said substrate between the active layer and the substrate.

18. The method of claim 11 wherein an etchant is used to remove the portion in step (b) and the change in color resulting when the etchant contacts the active layer is sensed to indicate when step (b) should terminate.

19. The method of claim 11 wherein the substrate and top layer is InP and the active layer is GaInAsP.

20. The method of claim 19 wherein the layers are formed by epitaxial deposition.

21. The method of claim 19 wherein the heating temperature in step (d) is in the range of 650° C. to 700° C.

22. The method of claim 19 wherein $PH_3$ gas is introduced during step (d) to prevent decomposition of exposed InP in the top layer.

23. The method of claim 11 wherein the protective coating is an oxide layer formed by photolithography.

24. The method of claims 11 and 19 in which the undercut areas have substantial surface energy in the corners of the undercut areas and migration of material in the regions of the undercut areas is caused by heating without a temperature gradient between the active layer and top layer.

25. The method of claim 24 in which the heating is unaccompanied by an external chemical which chemically acts as a chemical transport agent.

26. The method of claims 11 or 19 wherein the structure is a laser heterostructure and the migrated material encloses the exposed sides of said volume of active layer to confine the active layer laterally and thereby produce a buried heterostructure with reduced threshold current.

27. The method of forming a mirror surface on a semiconductor device comprising the steps of:
(a) making a body by:
(i) forming a substrate;
(ii) forming an active layer of semiconductor material on the substrate;
(iii) forming a top layer on the active layer; and
(iv) forming a coating over a portion of the top surface substantially perpendicular to an adjacent side of the sample;
(b) removing a portion of said top layer on said adjacent side down to the top surface of the active layer;
(c) removing a portion of said active layer underlying the remaining top layer to produce an undercut area beneath the remaining top layer;
(d) heating the body to cause the material in the region of the undercut area to migrate into the undercut area adjacent the active layer; and
(e) removing further material on the top layer and substrate including the migrated material until a smooth mirror surface is formed on said adjacent side of the sample.

28. The method of claim 27 wherein step (b) and (c) are performed by different etchants; the etchant in step (c) being primarily effective in dissolving the active layer but not the top layer.

29. The method of claim 27 wherein layers are epitaxially grown.

30. The method of claim 29 wherein the top layer and substrate are binary compounds and the active layer is a quaternary alloy.

31. The method of claim 29 wherein the top layer is doped with a p-type dopant and the active layer and substrate are doped with n-type material.

32. The method of claim 27 wherein an etchant is used to remove the portion in step (b) and the change in color resulting when the etchant contacts the active layer is sensed to indicate when step (b) should terminate.

33. The method of claim 27 wherein the coating is an oxide layer formed by photolithography.

34. The method of forming a mirror surface on a heterostructure semiconductor laser device comprising the steps of:
(a) making a heterostructure by:
(i) forming a substrate;
(ii) forming an active layer of quaternary III-V alloy semiconductor material on the substrate;
(iii) forming a top layer of a binary compound semiconductor material on the active layer; and
(iv) forming a coating over a portion of the top surface of the top layer substantially perpendicular to an adjacent side of the sample;
(b) removing a portion of said top layer on said adjacent side down to the top surface of the active layer by etching said binary compound but not said III-V alloy;
(c) removing a portion of said active layer underlying the remaining top layer to produce an undercut area beneath the remaining top layer by etching said quaternary III-V alloy but not said binary compound; and (d) heating the heterostructure to cause the material in the region of the undercut area to migrate into the undercut area adjacent the active layer.

35. The method of forming a buried layer of quaternary III-V material in a heterojunction device having alternate layers of quaternary III-V material and binary III-V material comprising the steps of:
   (a) selectively etching only the binary material until a mesa of binary material is formed over the layer of quaternary material and a surface of quaternary material is exposed on two sides of said mesa;
   (b) selectively etching only the quaternary material at the exposed surfaces until two undercut regions are formed under the mesa with a layer of quaternary material therebetween which is exposed on two sides; and
   (c) filling in the undercut region with binary material from said mesa sufficient to bury the exposed portions of said quaternary material.

36. The method of claim 35 in which the filling in step (c) is accomplished by heating the heterostructure until material from the mesa migrates into the undercut region.

* * * * *